United States Patent [19]

Lamb

[11] Patent Number: 5,306,962
[45] Date of Patent: Apr. 26, 1994

[54] QUALIFIED NON-OVERLAPPING CLOCK GENERATOR TO PROVIDE CONTROL LINES WITH NON-OVERLAPPING CLOCK TIMING

[75] Inventor: Joel D. Lamb, Ft. Collins, Colo.

[73] Assignee: Hewlett-Packard Company, Palo Alto, Calif.

[21] Appl. No.: 902,231

[22] Filed: Jun. 22, 1992

Related U.S. Application Data

[63] Continuation-in-part of Ser. No. 619,280, Nov. 27, 1990, Pat. No. 5,124,572.

[51] Int. Cl.$^5$ .................... H03K 5/13; H03K 7/00; H03K 17/00; G11C 19/00
[52] U.S. Cl. ..................... 307/269; 307/480; 328/63; 328/72; 377/78
[58] Field of Search ............ 307/269, 480; 328/63, 328/72; 377/78

[56] References Cited

U.S. PATENT DOCUMENTS

| | | |
|---|---|---|
| 4,827,157 | 5/1989 | Machida et al. ............... 307/269 |
| 4,922,137 | 5/1990 | Small et al. ................... 307/269 |
| 4,970,405 | 11/1990 | Hagiwara ....................... 307/269 |
| 4,999,526 | 3/1991 | Dudley .......................... 307/269 |

*Primary Examiner*—William L. Sikes
*Assistant Examiner*—Trong Phan
*Attorney, Agent, or Firm*—Guy J. Kelley

[57] ABSTRACT

A clocking methodology for VLSI chips which uses global overlapping clocks, locally or remotely generated non-overlapping clocks, combined with pipeline control signals to generate signals which control the transfer gates of registers in a pipeline. The signals which control the transfer gates of the registers in a pipeline maintain the important timing relationships of the non-overlapping clock signals combined with the control signals. The global overlapping clocks are used where possible to provide timing advantages, while the non-overlapping clocks are used to eliminate race conditions as data propagates down a pipeline of transparent registers. Overlapping clock signals are used whenever such race conditions can be avoided, as at the ends of the registered pipeline, with the resultant performance improvement.

11 Claims, 9 Drawing Sheets

QUALIFIED NON-OVERLAPPING CLOCK GENERATOR TO PROVIDE CONTROL LINES WITH NON-OVERLAPPING CLOCK TIMING

CROSS-REFERENCE TO RELATED APPLICATIONS

This is a continuation-in-part of U.S. patent application Ser. No. 07/619,280, filed Nov. 27, 1990, now U.S. Pat. No. 5,124,572, issued, Jun. 23, 1992, and assigned to the assignee of the present application.

BACKGROUND OF THE INVENTION

1. Field of the Invention

The present invention relates to a VLSI clocking methodology which uses both global overlapping and global or locally generated non-overlapping clocks, and more particularly, to a clocking system which selectively uses non-overlapping clocks to eliminate race conditions, selectively uses overlapping clocks for performance enhancement, and combines conditional signals with the clock signals.

2. Description of the Prior Art

The performance of very large scale integration (VLSI) systems has been improved by designing hardware which can handle greater clock frequencies. However, as the clock frequencies to such circuits are increased, increased efforts must be made to prevent performance degradation as a result of clock skew and the like. Unfortunately, since pipelined data processing systems generally use global clocks, which are generally a pair of differential symmetric clocks generated by a centralized clocking circuit, the skew and the rise/fall times of the clocking signals received by the respective pipelined circuits are poorly controlled. Thus, if the skew is large, slow clock signal fall times result which, for fast circuits, causes errors in the pipeline. Such errors are herein referred to as clock signal races and are characterized by pipeline situations in which data in one stage "sneaks" through to a subsequent stage before the proper clocking signal is received. As known to those skilled in the art, lost clock edges as a result of signal skew may lead to such errors.

Conventional techniques having overcome such clock signal race problems by using non-overlapping clock signals, which are typically differential clock signals in which one clock signal has a rising edge which occurs after a falling edge of the other clock signal and a falling edge which occurs before a rising edge of the other clock signal. Such signals prevent clock signal races in a pipelined circuit by deactivating a subsequent stage before data is allowed to propagate through the current stage. While such a clocking system prevents data from "sneaking" through to the next stage, it does so at significant performance cost due to the "dead" time between clock edges.

Global overlapping clocks generally provide timing advantages with respect to non-overlapping clocks in that there is no dead time between a falling edge of one clock signal and the rising edge of the other clock signal. As a result, early clock edges may be received which allow improved system performance of the pipelined circuits. Global overlapping clocks are also generally easier to distribute to the circuitry without closely controlling the clock skew caused by time/phase shifts. However, as just noted, if the clock skew is large, race conditions may be created which may cause information to be lost when only global overlapping clocks are used for clocking the pipelined circuits.

In order to prevent such race conditions and the resultant loss of data, quadrature clocking systems have been developed for use in pipelined circuits. Such quadrature clocking systems do not have the performance disadvantages of non-overlapping clocking systems and typically comprise two sets of overlapping clocks which are provided by two pairs of global clock drivers (or buffers). The extra set of overlapping clocks are offset with respect to the first set by approximately 90° (i.e., they are shifted by 90° with respect to the first set of clock signals) such that a minimum amount of overlap time can be used to prevent races between respective stages of the pipelined circuits. However, enough overlap must be provided to allow a minimum time to set the latches of the pipelined circuits. The four clock edges of the quadrature clocking signals can then be applied to the respective stages of the pipelined circuits as appropriate. This allows the system to keep data moving without allowing data to "sneak" through a stage to before the appropriate clock edge is received.

Although a quadrature clocking system is generally quite effective at eliminating race conditions, such a clocking system requires that two extra clocking signals be routed to the respective chips and that extra buffer space be provided for the clocking signals. In addition, quadrature clocks comprised of overlapping clock signals are still susceptible to the skew problems of global overlapping clocks noted above without the benefits of early edges.

In pipelines or portions of pipelines which utilize both conditional signals to regulate the flow of data and the clock signals, twice the number of gates are used, one for the clock signal and one for the conditional signal. This decreases the speed of the pipeline and increases the power consumed.

SUMMARY OF THE INVENTION

The present invention relates to a clocking methodology for VLSI chips which uses global overlapping clocks plus locally or remotely generated non-overlapping clocks. Four clock edges are thus available in each block of the chip for use as timing edges. The global overlapping clocks are used when possible to provide timing advantages, while the non-overlapping clocks are used to eliminate race conditions as data propagates through the pipelined circuit in response to the clocking signals. The non-overlapping clocks are combined with conditional signals to reduce the number of transfer gates in the pipeline while avoiding race conditions.

Such a clocking system in accordance with the invention preferably drives a pipeline of transparent data registers with two overlapping clocks CK1 and CK2, two non-overlapping clocks CK1N and CK2N, and conditional signals so as to prevent race conditions while maximizing performance. In particular, the clocking system of the invention, which provides clocking signals to respective stages of a pipelined circuit, preferably comprises means for generating first and second overlapping differential clock signals CK1 and CK2 and means for generating from CK1 and CK2 first and second non-overlapping differential clocks signals CK1N and CK2N, CK1N having a rising edge which occurs after a falling edge of CK2N and a falling edge which occurs before a rising edge of CK2N. These clocking signals are then selectively provided to each stage of the pipelined circuit so as to prevent that stage from propagating data to a subsequent stage before the subsequent stage has been deactivated, thereby eliminating race conditions. However, the invention is further characterized in that at least one stage of the pipelined circuit receives CK1 or CK2 so as to decrease propagation time of data through the pipelined circuit and at least one stage of the pipelined circuit receives CK1N or CK2N. In other words, CK1N and CK2N are applied only when necessary to prevent race conditions while CK1 and CK2 are otherwise applied so as to gain performance advantage.

Where appropriate, CK1N and CK2N are combined with conditional signals which allow data to be conditionally transferred among the registers of the pipeline. The combined signals allow for the elimination of transfer gates while maintaining the critical timing relationships.

BRIEF DESCRIPTION OF THE DRAWINGS

The above and other features and advantages of the invention will become more apparent and more readily appreciated from the following detailed description of the presently preferred exemplary embodiments of the invention taken in conjunction with the accompanying drawings, in which.

DETAILED DESCRIPTION

The preferred embodiment of the invention will now be described with reference to the FIGS. 1-11. It will be appreciated by those of ordinary skill in the art that the description given herein with respect to those FIGS. 1-11 is for exemplary purposes only and is not intended in any way to limit the scope of the invention. All questions regarding the scope of the invention may be resolved by referring to the appended claims.

A preferred solution to one aspect of the problem of race conditions is disclosed in U.S. patent application Ser. No. 07/619,280, entitled VLSI Clocking System Using Both Overlapping And Non-Overlapping Clocks, filed Nov. 27, 1990, now U.S. Pat. No. 5,124,572, issued, Jun. 23, 1992, and incorporated herein by reference as if fully set forth below. Some of that application is reproduced herein in order to aid the readers of this document.

The above-identified application describes a clocking methodology for VLSI chips which uses global overlapping clocks plus locally or remotely generated non-overlapping clocks. Four clock edges are thus available in each block of the chip for use as timing edges. The global overlapping clocks are used when possible to provide timing advantages, while the non-overlapping clocks are used to eliminate race conditions as data propagates through the pipelined circuit in response to the clocking signals.

Two overlapping clocks CK1 and CK2 are used for providing timing advantages of the type described in the background portion of this specification, and two non-overlapping clocks CK1N and CK2N are provided for eliminating race conditions as data propagates down a pipeline of registers responsive to the clock inputs. The global overlapping clocks are preferably designed to have a minimum amount of overlap or underlap such that clock skew is held to be less than 1 nsec for all inputs. The non-overlapping clocks are generated from the overlapping clocks either globally for application to all chips, locally at each chip, or locally at each block of the chip. Typically, the registers of the register pipeline are responsive to edges of the overlapping and non-overlapping clocks for propagating data downstream.

In a preferred embodiment of the invention, the non-overlapping clocks are locally generated at each block of the chip so that local clock skew may be better controlled. By locally generating the non-overlapping clocks in this manner, more control exists over the rise/fall times of the local clocks, and as a result, worst-case race conditions may be handled even for fast VLSI chips.

FIGS. 1(a)-(d) illustrate the timing relationships of the four clock signals CK1, CK2, CK1N and CK2N. As shown in FIGS. 1(a) and (b), CK1 and CK2 are differential overlapping clock signals; however, both can be high at the same time within an acceptable clock skew tolerance. CK1N and CK2N, on the other hand, are differential non-overlapping clock signals having a dead time between the time one clock falls and the other clock rises as shown in FIGS. 1(c) and (d). In addition, as shown, the edge of CK1 falls before CK2N rises, while CK2N is allowed to overlap the rising edge of CK1 but not the rising edge of CK1N. Also, by symmetry, the edge of CK2 falls before CK1N rises, while CK1N is allowed to overlap the rising edge of CK2 but not the rising edge of CK2N. Proper use of such clocking signals in accordance with the invention can eliminate race conditions while maximizing performance as will be described below.

Figure 2:
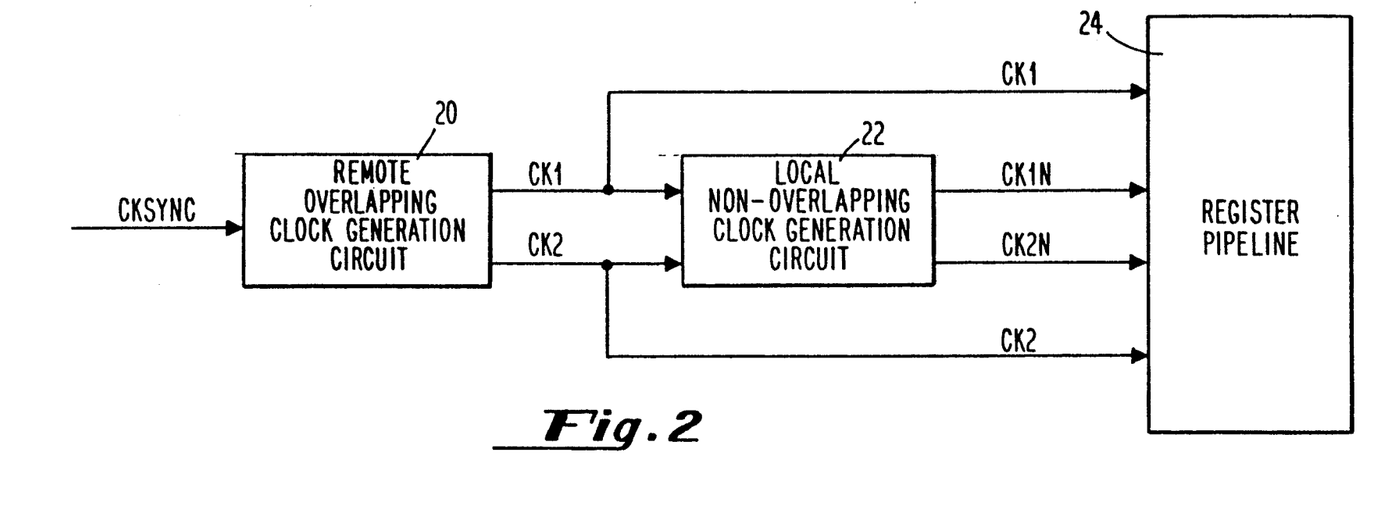
FIG. 2 illustrates a clock distribution system which provides overlapping and non-overlapping clock signals to a register pipeline in accordance with a preferred embodiment of the invention.

FIG. 2 illustrates a clock distribution system. As shown, global overlapping clock generation circuit 20 generates from a synchronizing signal CKSYNC overlapping clock signals CK1 and CK2. Overlapping clock generation circuit 20 generally comprises global clock drivers which buffer the clock inputs and provide low delay, high capacitance drive outputs in accordance with known techniques. Preferably, the global overlapping clock generation circuit 20 and its clock distribution network are designed in such a manner that the distribution delays and skews are minimized. Outputs CK1 and CK2 of the overlapping clock generation circuit 20 are then input into a non-overlapping clock generation circuit 22 which may be external to the chip, but which in a preferred embodiment, is on the chip. As will be described below with reference to FIG. 3, non-overlapping clock generation circuit 22 contains non-overlapping clock generators which introduce a dead time between the falling edge of CK1N and the rising edge of CK2N and a dead time between the falling edge of CK2N and the rising edge of CK1N. The four clock signals CK1, CK2, CK1N and CK2N are then input into a register pipeline 24 for controlling propagation of data therethrough as will be described below with reference to FIGS. 4–7.

Figure 1:
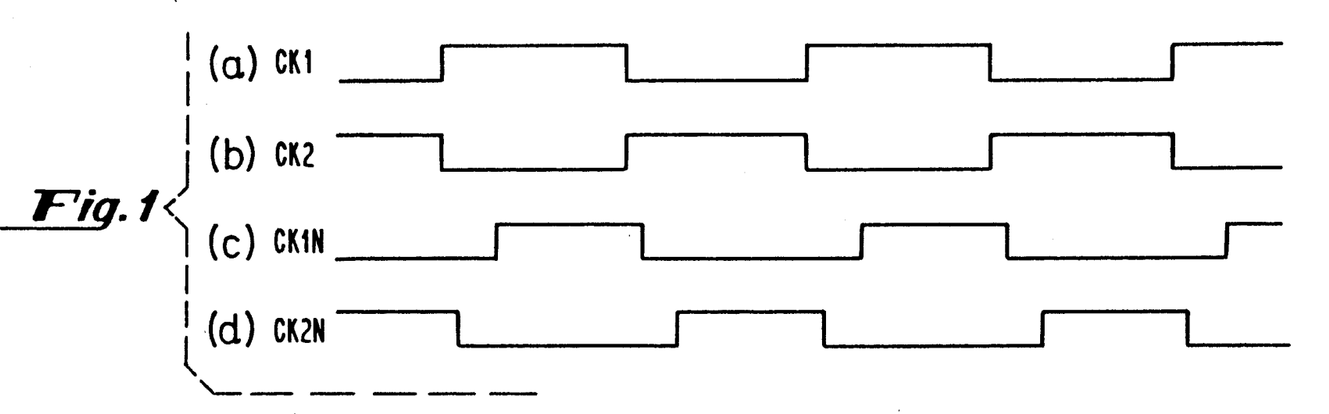
FIGS. 1(a)-(d) illustrate the timing relationships of two overlapping clock signals (FIGS. 1(a) and (b)) and two non-overlapping clock signals (FIGS. 1(c) and (d)).
Figure 3:
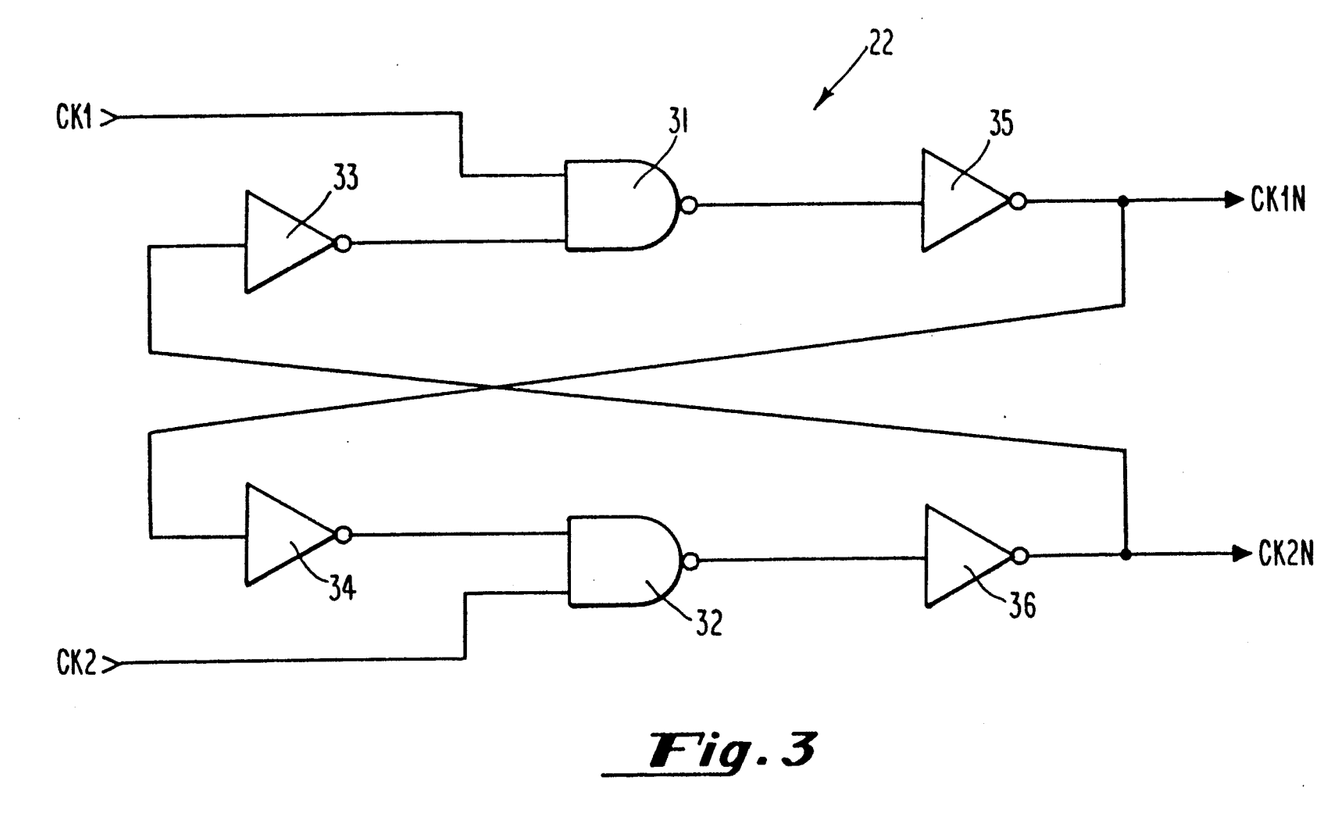
FIG. 3 illustrates a block diagram of a non-overlapping clock generation circuit of the type shown in FIG. 2.

FIG. 3 illustrates a preferred embodiment of a non-overlapping clock generation circuit 22. As shown in FIG. 1, the falling edge of CK1 causes the CK1N output to go low, while only after CK2 goes high and CK1N goes low is CK2N allowed to go high. As a result, the non-overlapping clock generation circuit 22 of the invention is designed to be symmetric so that CK1N is generated in the same manner as CK2N. In particular, the clock inputs CK1 and CK2 are input into respective NAND gates 31 and 32, while the other inputs of the NAND gates 31 and 32 receive the outputs of inverter circuits 33 and 34, which, in turn, receive the respective feedback outputs from inverters 35 and 36. Preferably, NAND gates 31 and 32 and inverters 35 and 36 are made fast in order to minimize the delay from the falling edge of CK1 to the falling edge of CK1N. However, inverters 33 and 34 are preferably relatively slow to ensure enough dead time between the clock signal edges of CK1N and CK2N even under fast process conditions.

As noted above, the non-overlapping clock generation circuit 22 may generate global or local non-overlapping clock signals CK1N and CK2N. However, if the non-overlapping clocks are generated globally, two more clock signal paths must be routed on each chip of the register pipeline and more clock skew between phases is introduced into the timing system because of the clock routing. Thus, the non-overlapping clock generation circuit 22 of the invention is preferably disposed on each chip for local rather than global clock signal generation. This makes it easier to control the skew between phases of the non-overlapping clock. By disposing the non-overlapping clock generation circuits 22 in each block, the amount of capacitive loading on the global clock network is correspondingly reduced. The reduced capacitance thus allows faster edges and smaller skews on the global overlapping clocks, which further improves the performance of the critical timing paths which use the global overlapping clocks. Hence, the presently preferred embodiment of the invention uses non-overlapping clock generation circuits 22 which generate local non-overlapping clock signals at each block of the chip.

Figure 4:
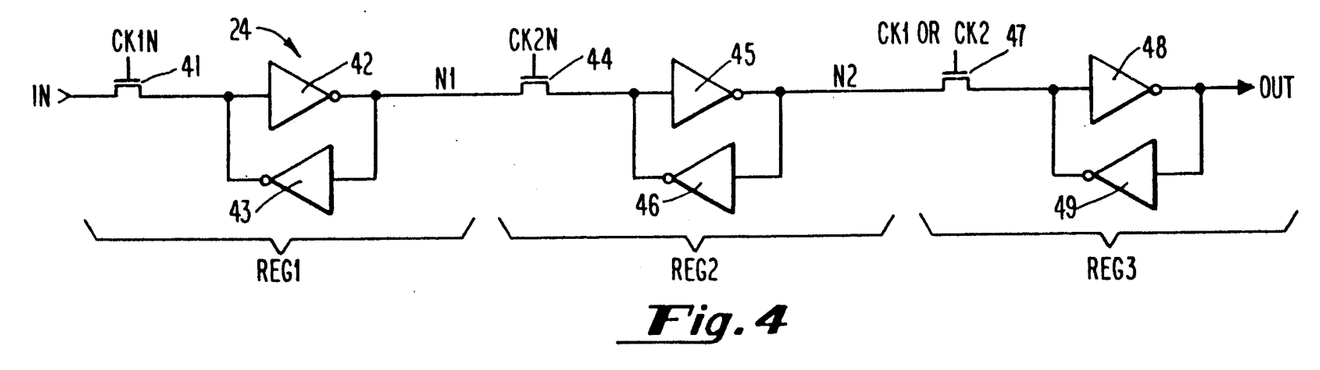
FIG. 4 illustrates a simple embodiment of a register pipeline of the type shown in FIG. 2.

FIG. 4 illustrates a simple embodiment of register pipeline 24 which is responsive to the overlapping and non-overlapping clock signals described below. Generally, the register pipeline 24 of FIG. 4 comprises a series of transparent registers such as registers REG1, REG2 and REG3 which are used to propagate data through the register pipeline in response to respective edges of the clocking signals. As shown in FIG. 4, when an input signal IN is received, it is clocked through an FET switch 41 into a first register REG1 having inverters 42 and 43 in response to non-overlapping clock signal CK1N. The output of REG1 at node N1 is then clocked through FET 44 by non-overlapping clock signal CK2N into REG2 having inverters 45 and 46. Then, the output at node N2 of REG2 is clocked through FET 47 into REG3 having inverters 48 and 49 by overlapping clock signal CK1. In the embodiment shown, the output of REG3 is then provided to the output OUT. As will be described below, the data propagation through the register pipeline 24 of FIG. 4 is performed without race conditions and with increased performance by proper selection of the respective clocking signals. For example, in the embodiment of FIG. 4, OUT is received sooner than in prior art systems since the last register, REG3, outputs the data in response to CK1 rather than waiting for the appropriate edge of CK1N. This improvement becomes substantial for some systems, such as those with many short pipelines.

Figure 5:
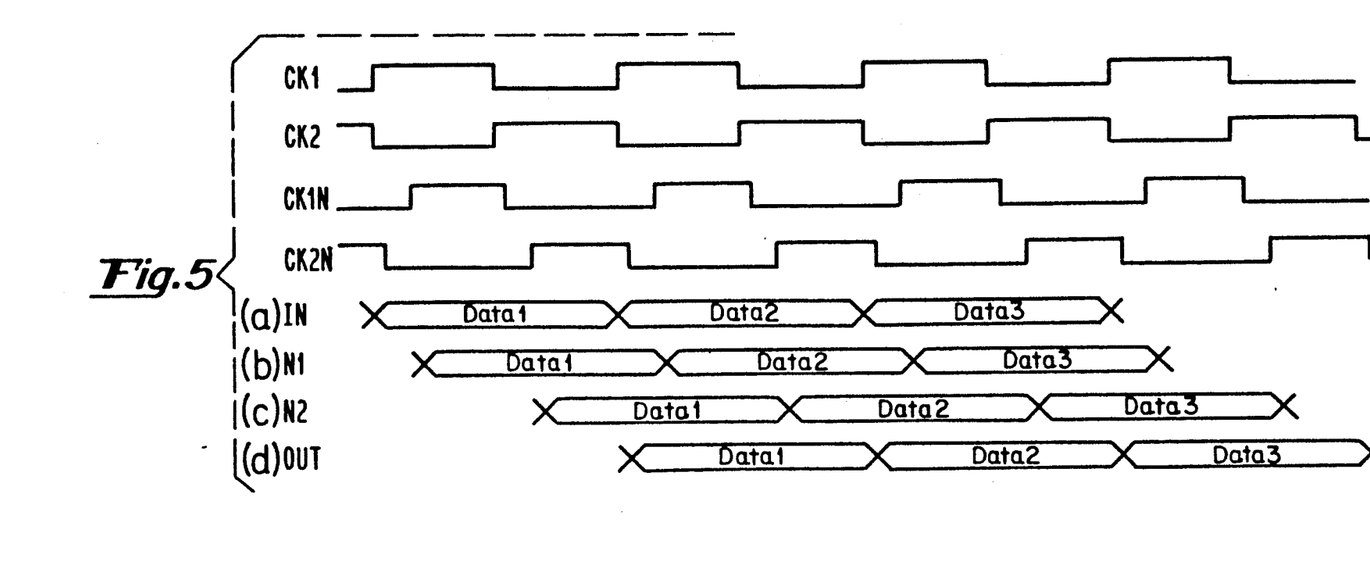
FIGS. 5(a)-(d) illustrate timing diagrams indicating how data is clocked through the register pipeline of FIG. 4.

Clock edges of clock signals CK1 and CK2 are used in the register pipeline when possible to start the data propagating sooner, while CK1N and CK2N are used in the register pipeline as necessary to prevent clock signal races. However, there are several bounds to such placement of clock edges CK1, CK2, CK1N and CK2N in the register pipeline 24. For example, the speed of the logic places a lower bound on the duration of the clock period. As shown in FIGS. 4 and 5, the data starts to propagate through the first stage (REG1) on the rising edge of CK1N as shown in FIG. 5(a) and must be valid at the input of the subsequent stage (REG2) before CK2N goes low. Non-overlapping clocks, as noted above, introduce a dead time between the time when one clock edge goes low and the next edge is allowed to go high. This dead time delays the rising edge of CK1N and thus steals from the time available in the clock period for "useful" work. On the other hand, the amount of dead time between non-overlapping clock edges must be large enough to prevent race conditions between adjacent registers. The amount of dead time must be large enough to compensate for skews in generating and distributing the non-overlapping clocks. These skews are due largely to differences in the RC delays in the distribution network and to differences in the loading of the two phases. With larger die sizes and higher operating frequencies, the amount of dead time required to generate non-overlapping clock edges becomes a significant percentage of the clock period. Of course, this is undesirable. For fast processes, the dead time must be large enough to ensure non-overlapping clock edges, while the dead time for slow processes will unfortunately be even larger. This dead time is wasted in clock methodologies which employ only non-overlapping clocks.

Accordingly, the above-described clocking methodology uses the non-overlapping clocks in the stages where race conditions are a problem, and overlapping clocks are used in situations where possible to provide a performance advantage. Thus, the dead time between non-overlapping clock edges is not wasted for those situations in which overlapping clock signals may be used without introducing errors caused by race conditions.

As noted above, race conditions occur when the clock input to a register such as REG1 is allowed to rise before the clock input to REG2 falls (FIG. 4). This may occur when overlapping clocks are used, for if the propagation delay through REG1 is less than the amount of clock overlap, the data which is being latched into REG1 can "sneak" into REG2 and subsequent stages as well without being stopped by the proper clock edge. This race condition is avoided by the use of non-overlapping clocks CK1N and CK2N in accordance with the invention. The use of such non-overlapping clocks guarantees that the clock input to REG2 is low before the clock input to REG1 is allowed to rise, thereby preventing a sneak path from existing. For example, as shown in FIG. 4, the output of REG1 at node N1 is valid at the falling edge of CK1N (FIG. 5(b)), but REG2 must wait until CK2N rises before propagating the data to node N2 (FIG. 5(c)). As a result, no race conditions may occur and no data may sneak from REG1 to REG2. However, there are situations in which an overlapping clock can safely be used to improve the system performance such that the dead time may be eliminated while still providing immunity to the master-slave race condition.

An example of where an overlapping clock signal may be used in the register pipeline 24 so as to improve performance is shown in the final register stage of FIG. 4. As shown, REG3 uses the global overlapping clock CK1 rather than the non-overlapping clock CK1N while still avoiding a race condition between REG2 and REG3 since CK1 is guaranteed to fall before CK2N is allowed to rise by the non-overlapping clock generation circuit 22. This may be seen in FIG. 5(d). The advantage of using the overlapping clock CK1 in REG3 is that CK1 occurs earlier than CK1N. As a result, the dead time between CK2N falling and CK1N rising is not wasted. The use of CK1 further allows OUT to become valid earlier than if CK1N was used, thereby providing an important performance advantage.

FIGS. 5(a)–(d) illustrate the propagation of data through the register pipeline 24 of FIG. 4 in accordance with the techniques just described. As shown, input data IN (FIG. 5(a)) is input into REG1 when CK1 goes high. When CK1N goes high, data is propagated to node N1 as shown in FIG. 5(b). Data is then propagated from node N1 of REG1 to REG2 on the rising edge of CK2N as shown in FIG. 5(c). The output at node N2 of REG2 is then propagated to REG3 upon the receipt of the next rising edge of CK1. As just noted, the rising edge of CK1 occurs prior to the rising edge of CK1N in accordance with the invention, and accordingly, the dead time between the falling edge of CK2N and the rising edge of CK1N is avoided. The speed of data throughput is thus enhanced.

Figure 6:
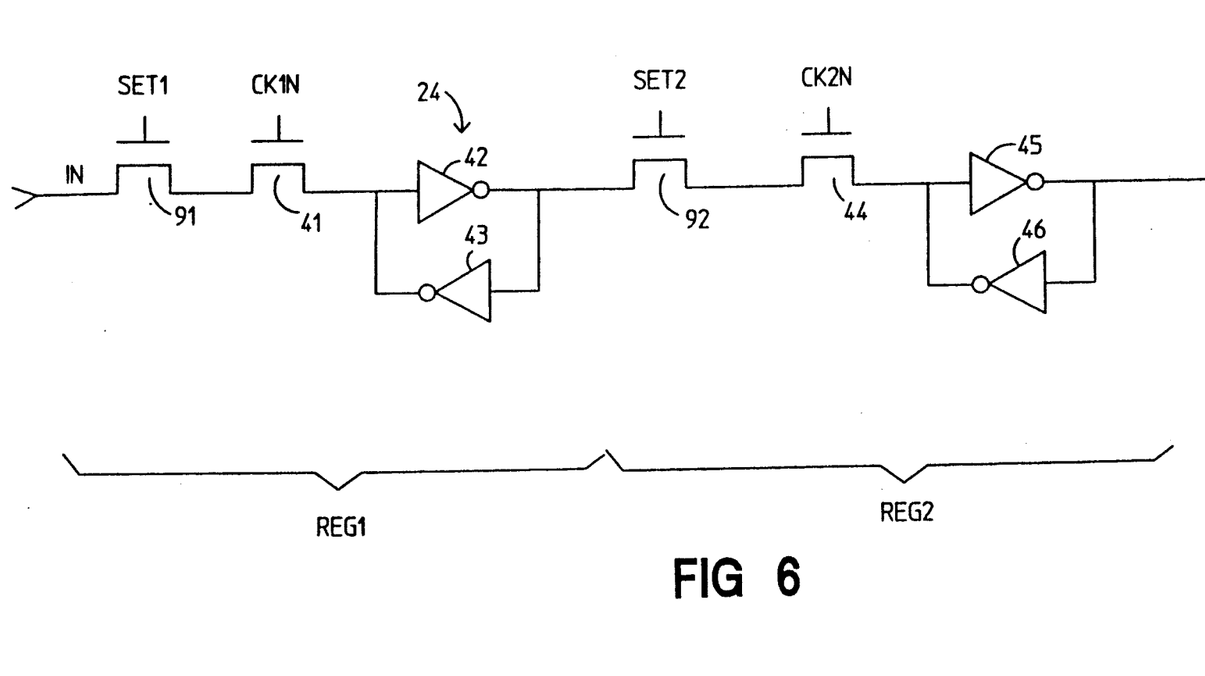
FIG. 6 illustrates a more general embodiment of a register pipeline.

A portion of a more general pipeline configuration which utilizes conditional signals SET1 and SET2 is shown in FIG. 6. The portion of the pipeline shown in FIG. 6 corresponds approximately to REG1 and REG2 of FIG. 4. FIG. 6 further includes two transfer gates designated as 91 and 92. Transfer gates 91 and 92 are controlled by signals SET1, and SET2 (conditional signals) respectively. Transfer gates 91 and 92 allow registers REG1, and REG2 to be set with data conditionally from the previous register in the pipeline. In other words, even though the proper clock pulse is present, a register will only receive data when the corresponding transfer gate permits data to pass through. For example, data will pass from the input labeled IN to REG1 if the signal on transfer gate 91 (SET1) is active at the same time as the non-overlapping clock signal CK1N on FET 41 is also active.

Figure 7:
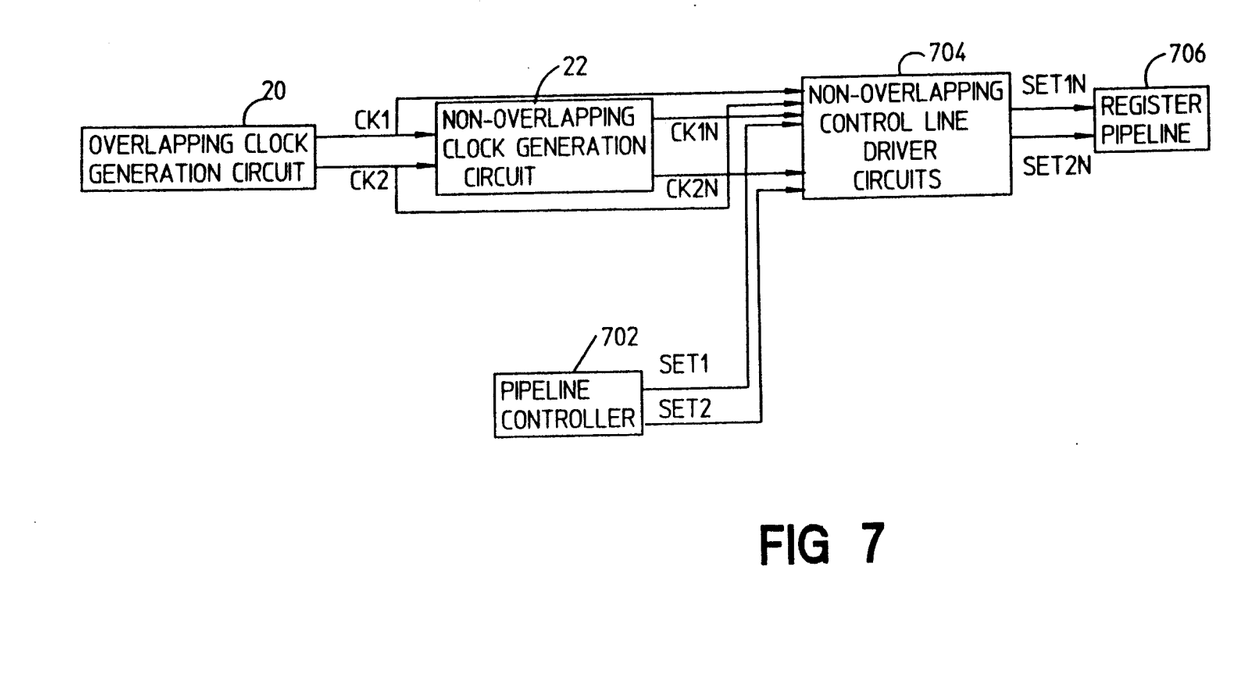
FIG. 7 illustrates the clock distribution system including conditional signals.

FIG. 7 illustrates a clock distribution system which incorporates conditional signals SET1 and SET2. These conditional signals are generated by a pipeline controller 702.

Overlapping clock generation circuit 20 and non-overlapping clock generation circuit 22 have been previously discussed with reference to FIG. 2. The generation of pipeline conditional signals is well understood by those of ordinary skill in the art. A detailed discussion of that subject area is outside the scope of this document. The clock distribution system depicted in FIG. 7 differs from the system depicted in FIG. 2 in that a pipeline controller 702 and its associated conditional signals are present in FIG. 7.

Non-overlapping control line driver circuits 704 receive the non-overlapping clock signals CK1N and CK2N, the overlapping clock signals CK1 and CK2 and the conditional signals SET1 and SET2 as inputs. Non-overlapping control line driver circuit 704 then generates control signals SET1N and SET2N which are applied to the register pipeline 706.

Figure 8:
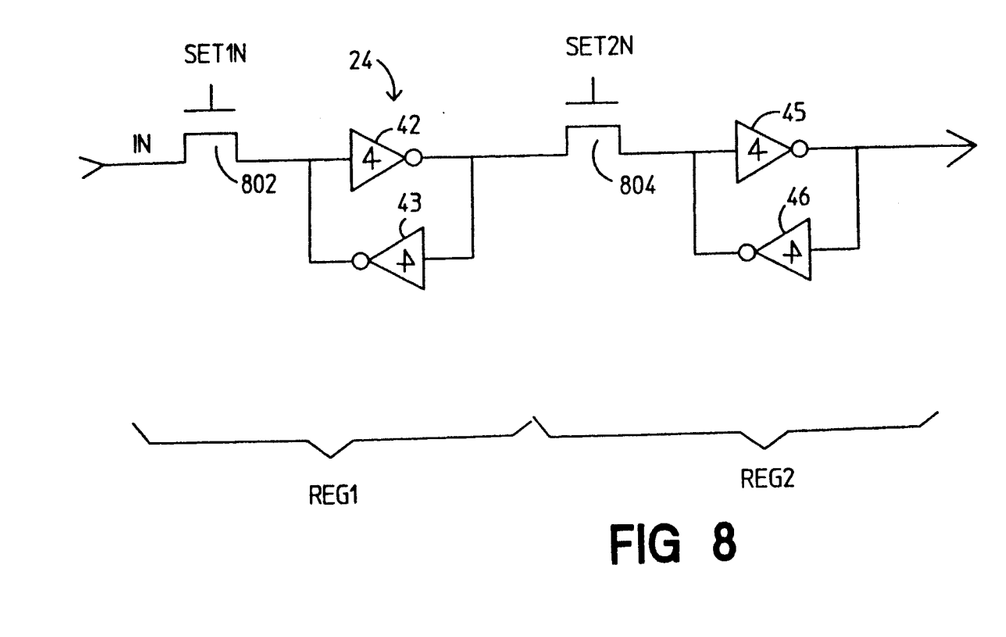
FIG. 8 illustrates an embodiment of a register pipeline in accordance with a preferred embodiment of the present invention.

Register pipeline 706 is represented in more detail in FIG. 8. In the circuit depicted in FIG. 8, the pair of FETs, transfer gate 91 and FET 41 have been replaced by a single transfer gate (FET) 802. Similarly, transfer gate 92 and FET 44 have also been replaced by a single transfer gate (FET) 804. The signal SET1N shown in FIG. 7 is applied to the gate of transfer gate 802 and the signal SET2N shown in FIG. 7 is applied to the gate of transfer gate 804.

The preferred embodiment of the present invention allows each register which utilizes a non-overlapping clock signal and is controlled by a conditional signal (e.g., SET1 or SET2) to be constructed using one fewer FET as can be seen by comparing FIG. 8 to FIG. 6. The advantage of having one less FET per register is weighed against the cost of needing a non-overlapping clock generator for each register set. This tradeoff is inefficient for a one-bit register but becomes quite efficient for a 16-or 32-bit register. Because the two FETs (e.g., 91 and 41 of register 1 in FIG. 6) are replaced with a single FET (e.g., FET 802 of register 1 of FIG. 8) the propagation delay is decreased. The increase in speed can be traded for size and power by making the single transfer gate smaller.

In order for the circuit shown in FIG. 8 to operate with the same timing and logic as the circuit shown in FIG. 6, the control signals SET1N and SET2N must be generated in such a way that they implement the logic shown in FIG. 6 while preserving the important timing relationships discussed previously.

In this specific example, SET1N is active when both SET1 and CK1N are active; and SET2N is active when both SET2 and CK2N are active. If the foregoing logical relationships were implemented by simply using AND gates, the timing relationship of the signals would change due to the propagation delay of an AND gate.

Figure 11:
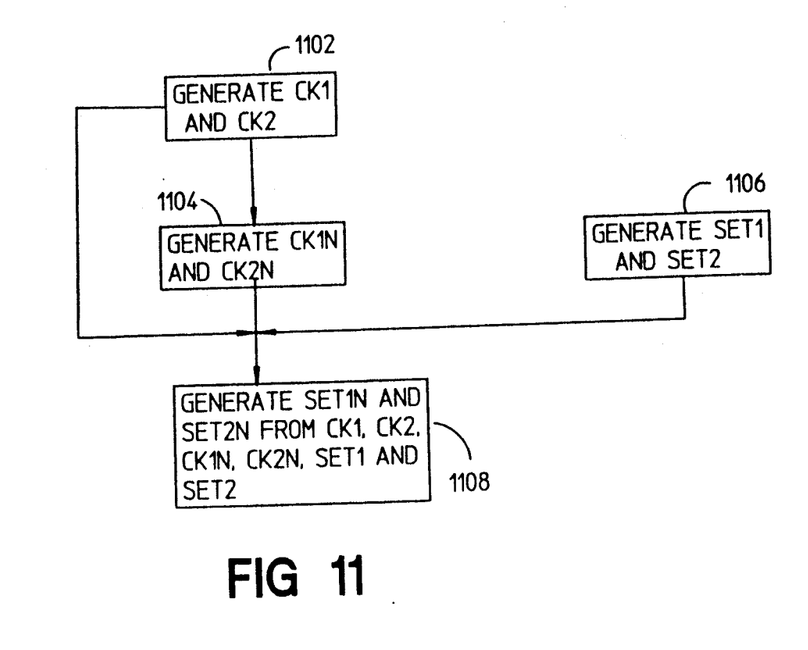
FIG. 11 is a flow diagram of the steps of a preferred method of the present invention.

The flow diagram in FIG. 11 depicts the general method utilized to produce the control signals SET1N and SET2N. First, the overlapping clock signals CK1 and CK2 are generated as indicated by the box labeled 1102. Next, the nonoverlapping clock signals CK1N and CK2N are generated from the overlapping clock signals CK1 and CK2 as indicated by the box labeled 1104. The conditional signals SET1 and SET2 are also generated in parallel with the overlapping clock signals as indicated by the box labeled 1106. Finally, the control signals SET1N and SET2N are generated from the overlapping clock signals CK1 and CK2, the nonoverlapping clock signals CK1N and CK2N, and the conditional signals SET1 and SET2 as indicated by the box labeled 1108.

Figure 9:
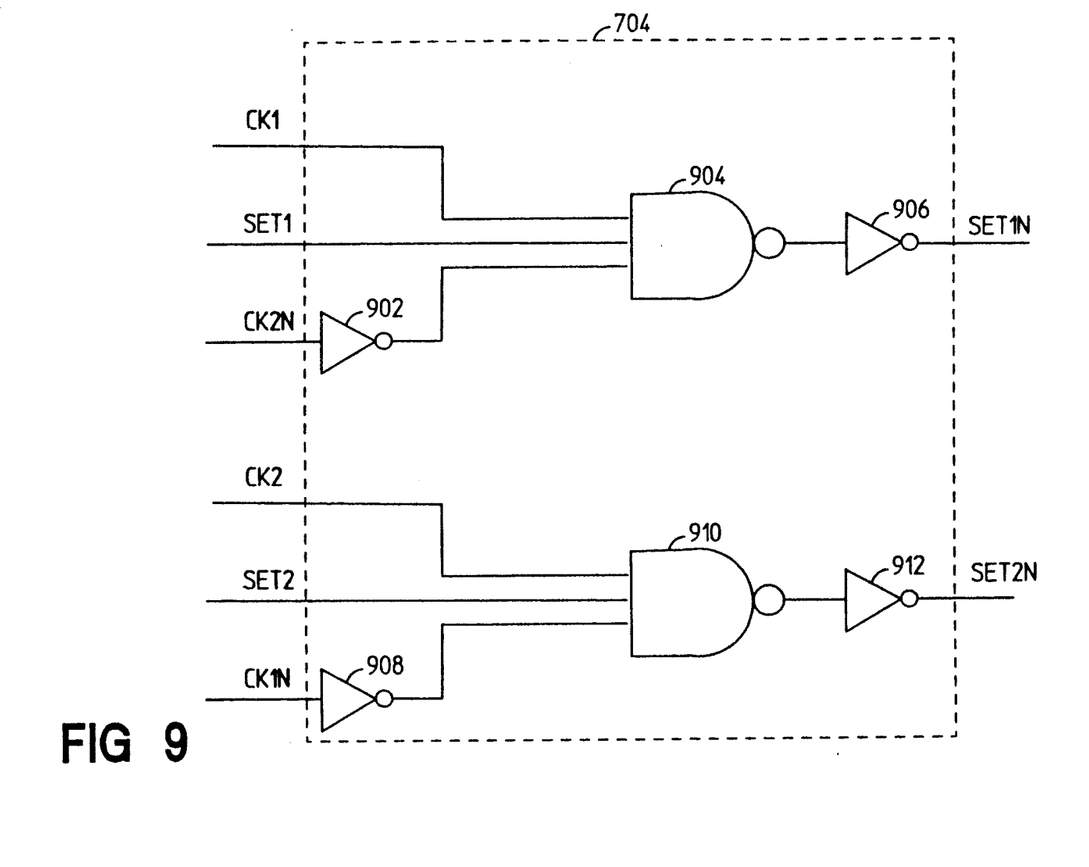
FIG. 9 illustrates a block diagram of a circuit for combining the non-overlapping clock signals and conditional signals in accordance with a preferred embodiment of the present invention.

The important timing relationships are maintained when the control signals SET1N and SET2N are generated by the circuits shown in FIG. 9. To generate the signal SET1N, the signal CK2N is first inverted at inverter 902 and proceeds into an input of NAND gate 904. Signals CK1 and SET1 are fed into the other inputs of NAND gate 904. The output from NAND gate 904 is inverted by inverter 906 and the output of inverter 906 is the signal SET1N.

Similarly, the signal SET2N is generated by first inverting the signal CK1N at inverter 908 and the output from inverter 908 is fed into an input of NAND gate 910. The signals CK2 and SET2 are fed into the other inputs of NAND gate 910. The output from NAND gate 910 is fed into input of inverter 912. The output of inverter 912 is the signal SET2N.

As will be appreciated by those of ordinary skill in the art, the circuits depicted in FIG. 9 are illustrative only and other implementations are possible without departing from the scope of the present invention.

The timing of the control signals SET1N and SET2N is of two general types depending upon the timing of the SET1 and SET2 signals. The above two described timing scenarios for SET1 and SET2 are the two normal timing patterns for those two signals.

Figure 10:
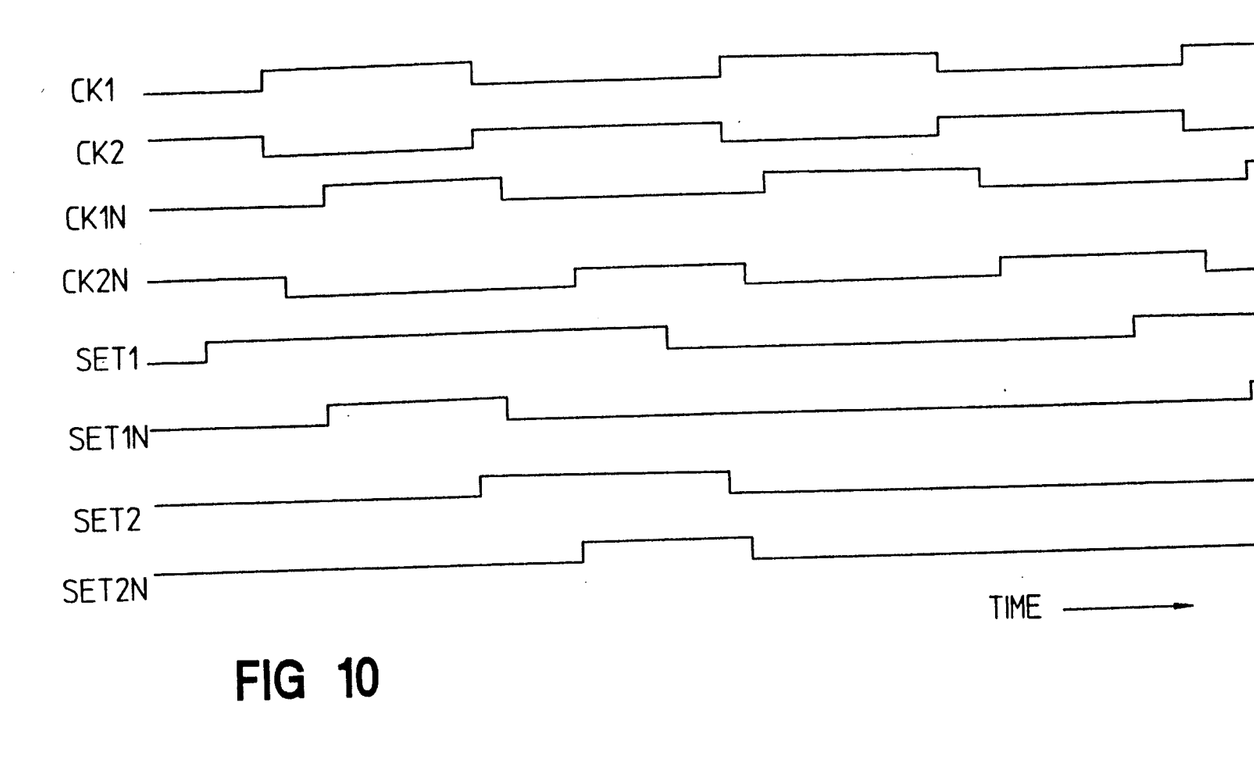
FIG. 10 illustrates the timing relationships of two overlapping clock signals, two non-overlapping clock signals, and two conditional signals.

The timing diagram in FIG. 10 illustrates both of the two general types of the timing of the SET1N and SET2N signals by using SET1 and SET1N to illustrate one case, and SET2 and SET2N to illustrate the other case. However, it should be clear that either case could be applied to either signal.

The first case occurs when SET1 goes high while CK1 is low, and SET1 stays high throughout the time that CK1 is high. In this case, as depicted in FIG. 10, SET1N has the same timing as CK1N. In other words, the circuit depicted in FIG. 9 which generates the signal SET1N according to the input depicted in FIG. 10, generates the signal SET1N which controls transfer gate 802 of FIG. 8 in exactly the same manner as transfer gate 901 and FET 41 of FIG. 6 would operate utilizing the same inputs.

The second general type of timing is depicted in FIG. 10 utilizing signal SET2. In this case, SET2 follows approximately the timing of CK2, a small amount of lag or lead is acceptable within acceptable skew limits. In this case, SET2N will be high during a subset of the time CK2N is high. Note that race conditions cannot occur under these circumstances.

The present invention encompasses a means for generating non-overlapping control signals from non-overlapping clock signals and pipeline conditional signals for use with a register pipeline. This permits the register pipeline to incorporate less transfer gates. In the type of circuit under discussion, power is dissipated by switching signals with electrical capacitance from high to low or from low to high levels, the gates of FETS (e.g., 91 and 41) are relatively capacitative. By eliminating one of the two series transfer gates in each register, power consumption is reduced due to the reduced capacitive switching.

Additional power can be saved by employing the present invention because the lines which control transfer gates 802 and 804 (FIG. 8) change less frequently than the lines which control transfer gates 41 and 44 of FIG. 6. This is because CK1N and CK2N change every clock cycle while SET1N and SET2N change less often. Power consumption is directly proportional to the frequency that a line changes. In the present invention the higher frequency change has been eliminated and a power savings results.

Those skilled in the art will readily appreciate that many modifications to the invention are possible within the scope of the invention. For example, the non-overlapping clock generation circuit 22 and the non-overlapping control line driver circuits 704 may be placed locally at a block of a chip, locally on the chip or on a particular PC board, or the non-overlapping clock generation circuit 22 may be located with the global overlapping clock generation circuit 20 at a point remote from the chip. In such a case, CK1, CK2, CK1N and CK2N would all be provided to the VLSI circuits of the system as global clocking signals. Of course, the clocking system of the invention may also be used with a much more complicated register pipeline 24 than that described herein. Accordingly, the scope of the invention is not intended to be limited by the preferred embodiments described above, but only by the appended claims.

We claim:

1. A control system for providing clocking and control signals to respective stages of a pipelined circuit in a system having conditional signals SET1 and SET2 for limiting the flow of data in the pipelined circuit, the control system comprising:
   first means for generating two overlapping differential clock signals CK1 and CK2;
   second means for generating two non-overlapping differential clock signals CK1N and CK2N from CK1 and CK2, CK1N having a rising edge which occurs after a falling edge of CK2N and a falling edge which occurs before a rising edge of CK2N;
   a plurality of transfer gates, the flow of data to each stage of the pipelined circuit, which is controlled by one of the conditional signals, being controlled by one of the plurality of transfer gates; and
   third means for generating control signals SET1N and SET2N, the control signals SET1N and SET2N maintain the timing considerations of the non-overlapping differential clock signals CK1N and CK2N, and the limits of the conditional signals SET1 and SET2, the control signals SET1N and SET2N being used for controlling the transfer gates.

2. The control system of claim 1 wherein the third means includes a first circuit for generating SET1N and a second circuit for generating SET2N.

3. The control system of claim 2 wherein the first circuit includes an inverter and a three input NAND gate with one inverted input, signal CK2N being input into the inverted input of the NAND gate and signals CK1 and SET1 being input into the other inputs of the NAND gate, the output of the NAND gate being the input to the inverter and the output of the inverter being SET1N.

4. The control system of claim 3 wherein the second circuit includes an inverter and a three input NAND gate with one inverted input, signal CK1N being input into the inverted input of the NAND gate and signals CK2 and SET2 being input into the other inputs of the NAND gate, the output of the NAND gate being the input to the inverter and the output of the inverter being SET2N.

5. The control system of claim 1 wherein the plurality of transfer gates includes a plurality of FETs, with the gate of each FET coupled to the third means.

6. A system for providing control signals to respective stages of a pipelined circuit in a system having conditional signals SET1 and SET2 for limiting the flow of data in the pipelined circuit, overlapping differential clocking signals CK1 and CK2, and non-overlapping differential clocking signals CK1N and CK2N, CK1N having a rising edge which occurs after a falling edge of CK2N and a falling edge which occurs before a rising edge of CK2N, the control system comprising:

a control signal generating circuit, the control signal generating circuit receiving the conditional signals, the overlapping clock signal CK1 and CK2 and non-overlapping clock signals CK1N and CK2N as inputs, the control signal generating circuit configured to output control signals such that they maintain the timing considerations of the non-overlapping differential clock signals and the limits of the conditional signals.

7. The system of claim 6 wherein the control signal generating circuit includes a first circuit having an inverter and a three input NAND gate with one inverted input, signal CK2N being input into the inverted input of the NAND gate and signals CK1 and SET1 being input into the other inputs of the NAND gate, the output of the NAND gate being the input to the inverter and the output of the inverter being a first control signal, and a second circuit having an inverter and a three input NAND gate with one inverted input, signal CK1N being input into the inverted input of the NAND gate and signals CK2 and SET2 being input into the other inputs of the NAND gate, the output of the NAND gate being the input to the inverter and the output of the inverter being a second control signal.

8. The system of claim 6 further including a plurality of transfer gates, the flow of data to each stage of the pipelined circuit, to which the flow of data is limited by the conditional signals, being controlled by one of the plurality of transfer gates, each transfer gate coupled to the control signal generating circuit.

9. The system of claim 8 wherein each transfer gate is a FET having a gate, each gate of each FET is coupled to the control signal generating circuit.

10. A method of generating control signals which combine the timing considerations of the clock signals and the limitations of conditional signals, comprising the steps of:

1) generating first and second overlapping differential clock signals CK1 and CK2;
2) generating from CK1 and CK2 first and second non-overlapping differential clock signals CK1N and CK2N, CK1N having a rising edge which occurs after a falling edge of CK2N and a falling edge which occurs before a rising edge of CK2N;
3) generating the control signals from the conditional signals, the overlapping clock signals CK1 and CK2, and the nonoverlapping clock signals CK1N and CK2N, the control signals generated such that they combine the timing of the non-overlapping clock signals and the limits of the conditional signals such that one signal controls one gate for each stage of the pipeline that is controlled by a conditional signal and a non-overlapping clock signal.

11. The method of claim 10 wherein step 2 further includes the step of generating conditional signals SET1 and SET2.

* * * * *